United States Patent
Kuo et al.

(10) Patent No.: US 9,953,685 B2
(45) Date of Patent: Apr. 24, 2018

(54) SEMICONDUCTOR DEVICE AND METHOD FOR FABRICATING THE SAME

(71) Applicant: eMemory Technology Inc., Hsinchu (TW)

(72) Inventors: Jui-Ming Kuo, Taichung (TW); Chun-Yuan Lo, Taipei (TW); Chia-Jung Hsu, Taoyuan County (TW); Wein-Town Sun, Taoyuan County (TW)

(73) Assignee: eMemory Technology Inc., Hsinchu (TW)

( * ) Notice: Subject to any disclaimer, the term of this patent is extended or adjusted under 35 U.S.C. 154(b) by 49 days.

(21) Appl. No.: 14/477,863

(22) Filed: Sep. 5, 2014

(65) Prior Publication Data

US 2015/0287738 A1 Oct. 8, 2015

Related U.S. Application Data

(60) Provisional application No. 61/973,867, filed on Apr. 2, 2014.

(51) Int. Cl.
*H01L 27/115* (2017.01)
*H01L 29/51* (2006.01)
(Continued)

(52) U.S. Cl.
CPC ............ *G11C 5/06* (2013.01); *G11C 16/0408* (2013.01); *G11C 16/0425* (2013.01);
(Continued)

(58) Field of Classification Search
CPC combination set(s) only.
See application file for complete search history.

(56) References Cited

U.S. PATENT DOCUMENTS

| 7,199,421 B2 | 4/2007 | Park et al. |
| 7,339,229 B2 | 3/2008 | Wang et al. |

(Continued)

FOREIGN PATENT DOCUMENTS

| TW | 201310579 | 3/2013 |
| TW | 201347148 | 11/2013 |
| TW | 201407781 | 2/2014 |

OTHER PUBLICATIONS

"Office Action of Taiwan Counterpart Application", dated Dec. 3, 2015, p. 1-p. 6.

(Continued)

*Primary Examiner* — Fernando L Toledo
*Assistant Examiner* — Lawrence-Linh T Nguyen
(74) *Attorney, Agent, or Firm* — JCIPRNET

(57) ABSTRACT

A semiconductor device and a method for fabricating the same are provided. The semiconductor device includes a substrate, a memory device, and a select transistor. The memory device is located on the substrate. The select transistor is located on the substrate and electrically connected to the memory device. The select transistor includes a select gate, a first dielectric layer, and a second dielectric layer. The select gate is located on the substrate. The first dielectric layer is adjacent to the second dielectric layer, and located between the select gate and the substrate. The first dielectric layer is closer to the memory device than the second dielectric layer. The thickness of the first dielectric layer is greater than the thickness of the second dielectric layer.

12 Claims, 8 Drawing Sheets

(51) Int. Cl.

| | | |
|---|---|---|
| G11C 5/06 | (2006.01) | |
| G11C 16/04 | (2006.01) | |
| G11C 17/16 | (2006.01) | |
| G11C 17/18 | (2006.01) | |
| H01L 27/112 | (2006.01) | |
| H01L 29/423 | (2006.01) | |
| H01L 29/78 | (2006.01) | |
| H01L 27/11529 | (2017.01) | |
| H01L 27/11573 | (2017.01) | |
| H01L 23/525 | (2006.01) | |
| G11C 16/10 | (2006.01) | |
| G11C 16/14 | (2006.01) | |
| G11C 16/26 | (2006.01) | |
| H01L 23/528 | (2006.01) | |
| H01L 27/11524 | (2017.01) | |
| H01L 29/06 | (2006.01) | |
| H01L 29/49 | (2006.01) | |
| H01L 27/11558 | (2017.01) | |
| H01L 27/11526 | (2017.01) | |
| H01L 29/93 | (2006.01) | |

(52) U.S. Cl.
CPC .......... *G11C 16/0433* (2013.01); *G11C 16/10* (2013.01); *G11C 16/14* (2013.01); *G11C 16/26* (2013.01); *G11C 17/16* (2013.01); *G11C 17/18* (2013.01); *H01L 23/528* (2013.01); *H01L 23/5252* (2013.01); *H01L 27/11206* (2013.01); *H01L 27/11524* (2013.01); *H01L 27/11526* (2013.01); *H01L 27/11529* (2013.01); *H01L 27/11558* (2013.01); *H01L 27/11573* (2013.01); *H01L 29/0649* (2013.01); *H01L 29/42328* (2013.01); *H01L 29/42368* (2013.01); *H01L 29/4916* (2013.01); *H01L 29/512* (2013.01); *H01L 29/7817* (2013.01); *H01L 29/7835* (2013.01); *H01L 29/93* (2013.01); *H01L 2924/0002* (2013.01)

(56) References Cited

U.S. PATENT DOCUMENTS

| | | | |
|---|---|---|---|
| 2003/0156460 A1* | 8/2003 | Wu | H01L 27/115 365/185.33 |
| 2005/0145919 A1* | 7/2005 | Chang | H01L 21/28282 257/314 |
| 2009/0273013 A1* | 11/2009 | Winstead | H01L 27/11526 257/315 |

OTHER PUBLICATIONS

"Office Action of China Counterpart Application," dated Jul. 3, 2017, p. 1-p. 5.

* cited by examiner

SEMICONDUCTOR DEVICE AND METHOD FOR FABRICATING THE SAME

CROSS-REFERENCE TO RELATED APPLICATION

This application claims the priority benefits of U.S. provisional application Ser. No. 61/973,867, filed on Apr. 2, 2014. The entirety of the above-mentioned patent application is hereby incorporated by reference herein and made a part of this specification.

BACKGROUND OF THE INVENTION

Field of the Invention

The invention relates to a semiconductor device and a method for fabricating the same.

Description of Related Art

Among various memory products, the non-volatile memory allows multiple data writing, reading, or erasing operations, and the data stored in the non-volatile memory is retained even after power to the device is removed. Hence, the non-volatile memory has become an indispensable part to a variety of electronic products.

Generally, the non-volatile memory includes a select transistor and a plurality of memory cells. In order that the select transistor has a low operation voltage to be turned on/off easily, a thinner gate dielectric layer is usually used in the select transistor. However, the thinner gate dielectric layer cannot sustain the high voltage applied by the neighboring memory cells. If the gate dielectric layer in the select transistor is made thicker for sustaining the high voltage of the memory cells, the operation voltage would be increased. Therefore, how to keep the operation voltage of the select transistor low while enabling the select transistor to sustain the high voltage applied by the neighboring memory cells is an important issue in this field.

SUMMARY OF THE INVENTION

The invention provides a semiconductor device and a method of fabricating the same, wherein while a select transistor has a lower operation voltage, the select transistor is capable of sustaining a high voltage applied by adjacent memory cells.

The invention provides a semiconductor device. The semiconductor device includes a substrate, a memory device, and a select transistor. The memory device is disposed on the substrate. The select transistor is disposed on the substrate and electrically connected with the memory device. The select transistor includes a select gate, a first dielectric layer, and a second dielectric layer. The select gate is disposed on the substrate. The first dielectric layer has a first thickness and is disposed between the select gate and the substrate. The second dielectric layer has a second thickness and is disposed between the select gate and the substrate and adjacent to the first dielectric layer. The first dielectric layer is closer to the memory device than the second dielectric layer. The first thickness is greater than the second thickness.

In an embodiment of the invention, a ratio of the second thickness to the first thickness is in a range of $1/10$ to $2/3$.

In an embodiment of the invention, the first thickness is in a range of 60-160 angstroms.

In an embodiment of the invention, the second thickness is in a range of 16-40 angstroms.

In an embodiment of the invention, a length of the first dielectric layer is greater than $1/5$ of a sum of lengths of the first dielectric layer and the second dielectric layer.

In an embodiment of the invention, the length of the first dielectric layer is in a range of $1/5$ to $1/2$ of the sum of the lengths of the first dielectric layer and the second dielectric layer.

In an embodiment of the invention, the memory device includes a control gate and a charge storage layer. The control gate is disposed on the substrate. The charge storage layer is disposed between the control gate and the substrate.

In an embodiment of the invention, a length of the select gate is greater than a length of the control gate.

In an embodiment of the invention, the semiconductor device further includes a first doped region, a second doped region, and a third doped region. The first doped region is disposed in the substrate between two adjacent select gates. The second doped region is disposed in the substrate between the select gate and the control gate. The third doped region is disposed in the substrate on a side of the control gate that is not adjacent to the select gate.

In an embodiment of the invention, the semiconductor device further includes a well region disposed in the substrate. The first doped region, the second doped region, and the third doped region are disposed in the well region. The well region is a first conductivity type; and the first doped region, the second doped region, and the third doped region are a second conductivity type.

The invention provides a fabricating method for fabricating a semiconductor device. The fabricating method includes the following. A substrate is provided. A patterned charge storage material layer is formed on the substrate, wherein the patterned charge storage material layer has a first opening that exposes the substrate. A first dielectric material layer is formed on the substrate exposed by the first opening. A mask layer is formed on the substrate, wherein the mask layer has a second opening that exposes the first dielectric material layer. The first dielectric material layer exposed by the second opening is removed with the mask layer as a mask to form a patterned first dielectric material layer, wherein the patterned first dielectric material layer has a third opening that exposes the substrate. The mask layer is removed. A second dielectric material layer is formed on the substrate exposed by the third opening. At least two control gates are formed on the substrate, and at least two select gates are formed between the control gates. Each of the select gates covers a portion of the patterned first dielectric material layer and a portion of the second dielectric material layer. Each of the control gates covers a portion of the charge storage material layer. The patterned first dielectric material layer and the second dielectric material layer not covered by the select gates are removed to form at least two first dielectric layers and at least two second dielectric layers. The patterned charge storage material layer not covered by the control gates is removed to form at least two charge storage layers. Each of the first dielectric layers has a first thickness, each of the second dielectric layers has a second thickness, and the first thickness is greater than the second thickness.

In an embodiment of the invention, the fabricating method further includes the following. A first doped region is formed in the substrate between two adjacent select gates. A second doped region is formed in the substrate between each of the select gates and the control gate adjacent thereto. A third doped region is formed in the substrate on a side of each of the control gates that is not adjacent to the select gates.

In an embodiment of the invention, the fabricating method further includes forming a well region in the substrate. The first doped region, the second doped regions, and the third doped regions are disposed in the well region. The well region is a first conductivity type; and the first doped region, the second doped regions, and the third doped regions are a second conductivity type.

In an embodiment of the invention, a length of the first dielectric layer is greater than 1/5 of a sum of lengths of the first dielectric layer and the second dielectric layer.

The invention provides a fabricating method for fabricating a semiconductor device. The fabricating method includes the following. A substrate including a first region, a second region, and a third region is provided, wherein the second region is disposed between the first region and the third region. A patterned charge storage material layer is formed on the first region of the substrate. A patterned first dielectric material layer is formed on the second region of the substrate to be adjacent to the patterned charge storage material layer. A second dielectric material layer is formed on the third region of the substrate. A select gate and a control gate are formed on the substrate. The select gate covers a portion of the patterned first dielectric material layer and a portion of the second dielectric material layer. The control gate covers a portion of the patterned charge storage material layer. The patterned first dielectric material layer and the second dielectric material layer not covered by the select gate are removed to form a first dielectric layer and a second dielectric layer. The patterned charge storage material layer not covered by the control gate is removed to form a charge storage layer. The first dielectric layer has a first thickness, the second dielectric layer has a second thickness, and the first thickness is greater than the second thickness.

In an embodiment of the invention, the fabricating method further includes the following. A first doped region is formed in the substrate on a side of the select gate that is not adjacent to the control gate. A second doped region is formed in the substrate between the select gate and the control gate. A third doped region is formed in the substrate on a side of the control gate that is not adjacent to the select gate.

In an embodiment of the invention, the fabricating method further includes forming a well region in the substrate. The first doped region, the second doped region, and the third doped region are disposed in the well region. The well region is a first conductivity type; and the first doped region, the second doped region, and the third doped region are a second conductivity type.

In an embodiment of the invention, a length of the first dielectric layer is greater than 1/5 of a sum of lengths of the first dielectric layer and the second dielectric layer.

Based on the above, the select transistor provided by the invention includes the first dielectric layer and the second dielectric layer. The first dielectric layer has the first thickness, and the second dielectric layer has the second thickness. The first thickness is greater than the second thickness. Because the second dielectric layer is thinner, the operation voltage of the select transistor is lower. Moreover, according to the invention, the thicker first dielectric layer is disposed adjacent to the memory device. Thus, while the select transistor has a low operation voltage, the select transistor can sustain the high voltage applied by the adjacent memory device.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
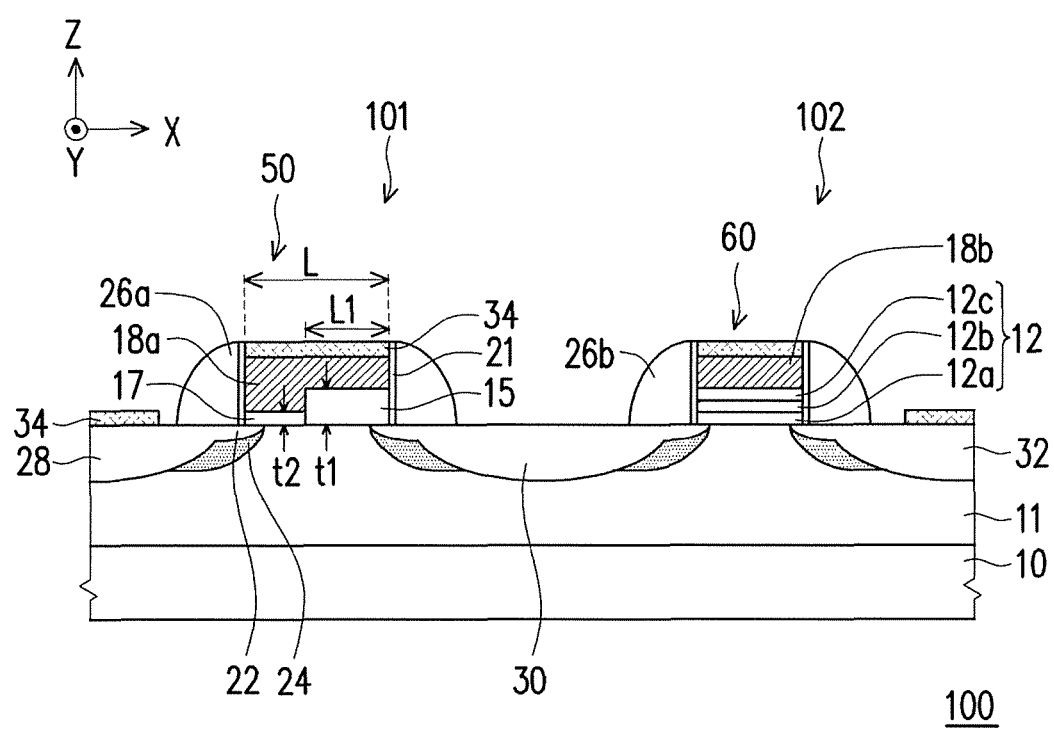
FIG. 1 is a schematic cross-sectional view illustrating a semiconductor device according to an embodiment of the invention.

FIG. 1 is a schematic cross-sectional view illustrating a semiconductor device according to an embodiment of the invention.

With reference to FIG. 1, a semiconductor device 100 includes a substrate 10, a select transistor 101, and a memory device 102. The select transistor 101 and the memory device 102 are disposed on the substrate 10 and are electrically connected with each other. In an embodiment, the semiconductor device 100 includes the substrate 10, the select transistor 101, and a plurality of the memory devices 102. The select transistor 101 is disposed on a side of the memory devices 102.

A material of the substrate 10 is a semiconductor material, for example. The semiconductor material is a semiconductor compound including silicon, silicon germanium, or other III/V elements or II/VI elements in the Periodic Table of Elements, for example. The substrate 10 may include an ion implanted region. In an embodiment, the substrate 10 includes a well region 11 therein. The well region 11 may be a first conductivity type. The well region 11 is an N-type well, an N+ buried layer, an N-implant, or a stack of a combination of the foregoing, for example. A dopant of the well region 11 is phosphorus or arsenic, for example.

The memory device 102 may be any device capable of storing data. In an embodiment, the memory device 102 includes a control gate 18$b$, a charge storage layer 12, a spacer 26$b$, a second doped region 30, and a third doped region 32. The control gate 18$b$ is disposed on the substrate 10. A material of the control gate 18$b$ includes polysilicon, metal, metal silicide, or a combination of the foregoing. The charge storage layer 12 is disposed on the substrate 10 and located between the control gate 18$b$ and the substrate 10. The charge storage layer 12 is a composite layer of an oxide layer 12$a$/a nitride layer 12$b$/an oxide layer 12$c$ (Oxide-Nitride-Oxide, ONO), for example, and the composite layer may include three or more layers. Alternatively, the charge storage layer 12 may be a floating gate, and a material thereof includes polysilicon and doped polysilicon, for example. The charge storage layer 12 may also be other types of semiconductor structures for storing charges. A thickness of the charge storage layer 12 is in a range of 90 to 200 angstroms, for example. The control gate 18$b$ and the charge storage layer 12 constitute a control gate stack structure 60. The spacer 26b is disposed on a sidewall of the control gate stack structure 60. A material of the spacer 26b is silicon oxide, silicon nitride, or a combination of the foregoing, for example.

The second doped region 30 and the third doped region 32 are disposed in the well region 11 on two sides of the control gate stack structure 60. More specifically, the second doped region 30 is disposed in the well region 11 between the select gate 18a and the control gate 18b. The third doped region 32 is disposed in the well region 11 on a side of the control gate 18b that is not adjacent to the select gate 18a. In an embodiment, the second doped region 30 and the third doped region 32 respectively serve as a drain and a source. The second doped region 30 and the third doped region 32 may be a second conductivity type. The second conductivity type is P type, for example. In an embodiment, a dopant of the second doped region 30, and the third doped region 32 is boron or boron difluoride, for example.

The select transistor 101 includes the select gate 18a, a first dielectric layer 15, a second dielectric layer 17, a spacer 26a, a first doped region 28, and the second doped region 30. The select gate 18a is disposed on the substrate 10 and adjacent to the control gate 18b. A material of the select gate 18a includes polysilicon, metal, metal silicide, or a combination of the foregoing. A length of the select gate 18a may be the same as or different from a length of the control gate 18b. In an embodiment, the length of the select gate 18a is greater than the length of the control gate 18b.

The first dielectric layer 15 and the second dielectric layer 17 are adjacent to each other and are disposed on the substrate 10 and between the select gate 18a and the substrate 10. A material of the first dielectric layer 15 and the second dielectric layer 17 is silicon oxide, silicon nitride, silicon oxynitride, or a high dielectric constant material having a dielectric constant greater than 4, for example. The first dielectric layer 15 is closer to the memory device 102 than the second dielectric layer 17. The first dielectric layer 15 has a first thickness t1, and the second dielectric layer 17 has a second thickness t2. The first thickness t1 of the first dielectric layer 15 is greater than the second thickness t2 of the second dielectric layer 17. In an embodiment, the first thickness t1 of the first dielectric layer 15 is in a range of 60-160 angstroms; and the second thickness t2 of the second dielectric layer 17 is in a range of 16-40 angstroms. In another embodiment, a ratio of the second thickness t2 of the second dielectric layer 17 to the first thickness t1 of the first dielectric layer 15 is in a range of 1/10 to 2/3. In addition, in an embodiment of the invention, a length L1 of the first dielectric layer 15 is greater than 1/5 of a sum w of the lengths of the first dielectric layer 15 and the second dielectric layer 17. In another embodiment of the invention, the length L1 of the first dielectric layer 15 is between 1/5 and 1/2 of the sum L of the lengths of the first dielectric layer 15 and the second dielectric layer 17.

The select gate 18a, the first dielectric layer 15, and the second dielectric layer 17 constitute a select gate stack structure 50. The spacer 26a is disposed on a sidewall of the select gate stack structure 50. A material of the spacer 26a is silicon oxide, silicon nitride, or a combination of the foregoing, for example.

The first doped region 28 and the second doped region 30 are disposed in the well region 11 on two sides of the select gate stack structure 50. More specifically, the first doped region 28 is disposed in the well region 11 on a side of the select gate 18a that is not adjacent to the control gate 18b. The second doped region 30 is a common doped region and disposed in the well region 11 between the select gate 18a and the control gate 18b. In an embodiment, the first doped region 28 and the second doped region 30 respectively serve as a source and a drain of the select transistor 101, and the second doped region 30 and the third doped region 32 respectively serve as a drain and a source of the memory device 102. The first doped region 28 and the second doped region 30 may be the second conductivity type. The second conductivity type is P type, for example. In an embodiment, a dopant of the first doped region 28 and the second doped region 30 is boron or boron difluoride, for example.

In an embodiment, the select transistor 101 and the memory device 102 further include a liner layer 21, a metal silicide 34, a lightly doped drain (LDD) 22, and a pocket implant region 24 respectively. The liner layer 21 may be disposed respectively between the spacer 26a and the select gate stack structure 50 and between the spacer 26b and the control gate stack structure 60. A material of the liner layer 21 is silicon oxide, silicon nitride, or a combination of the foregoing, for example. The metal silicide 34 may be disposed above the select gate 18a, the control gate 18b, the first doped region 28, and the third doped region 32. A material of the metal silicide 34 is cobalt silicide, nickel silicide, titanium silicide, copper silicide, molybdenum silicide, tantalum silicide, tungsten silicide, erbium silicide, zirconium silicide, platinum silicide, or a combination of the foregoing, for example. The lightly doped drain 22 may be disposed in the substrate 10 on two sides of the select gate stack structure 50 and the control gate stack structure 60. The lightly doped drain 22 may be the second conductivity type, which is P type, for example. The pocket implant region 24 may be disposed in the substrate 10 under the lightly doped drain 22. The pocket implant region 24 may be the first conductivity type, which is N type, for example. In an embodiment, doping concentrations of the lightly doped drain 22 and the pocket implant region 24 may be varied respectively as required by the select transistor 101 and the memory device 102.

It should be noted that the select transistor 101 of the invention includes the first dielectric layer 15 and the second dielectric layer 17 that have different thicknesses. Because the first dielectric layer 15 close to the memory device 102 is thicker, it can sustain a high voltage applied by the adjacent memory device 102. Because the second dielectric layer 17 is thinner, the select transistor 101 has a lower operation voltage.

In an experiment example, the thickness of the first dielectric layer 15 is 125 angstroms and the thickness of the second dielectric layer 17 is 35 angstroms. Given that the total length of the first dielectric layer 15 and the second dielectric layer 17 is 0.35 μm, when the length of the thicker first dielectric layer 15 is 0.12 μm, the semiconductor device has better driving capability than a thin-down semiconductor device having a dielectric layer of uniform thickness (120 angstroms). Accordingly, a thin-down process can be omitted.

Further, in another experiment, the thickness of the first dielectric layer 15 is 125 angstroms and the thickness of the second dielectric layer 17 is 35 angstroms, and the total length of the first dielectric layer 15 and the second dielectric layer 17 is 0.35 μm. When the length of the thicker first dielectric layer 15 is greater than 0.12 μm, the voltage endurance of the gate dielectric layer in the select transistor is improved effectively, such that the select transistor 101 sustains a voltage of 6V or more. Moreover, when the length of the thicker first dielectric layer 15 is greater than 0.12 μm, the voltage endurance of the select transistor 101 becomes stable as the length of the first dielectric layer 15 increases.

Moreover, in yet another experiment, the thickness of the first dielectric layer 15 is 125 angstroms and the thickness of the second dielectric layer is 35 angstroms, and the length of the second dielectric layer 17 is changed while the length of the thicker first dielectric layer 15 is fixed at 0.20 µm. It is known from the experiment result that, given that the leakage current of the semiconductor device is 0.1 µA, the total length of the first dielectric layer 15 and the second dielectric layer 17 is 0.24 µm to 0.35 µm, and the length of the first dielectric layer 15 is maintained at 0.20 µm, the select transistor 101 can sustain a voltage of −7.5V or more.

FIG. 2A to FIG. 2H are schematic cross-sectional views illustrating a fabricating method of a semiconductor device according to an embodiment of the invention.

Figure 2A:
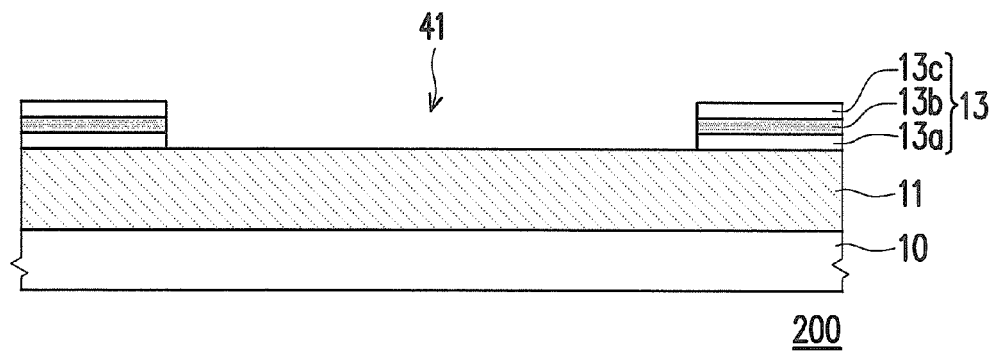
FIG. 2A to FIG. 2H are schematic cross-sectional views illustrating a fabricating method of a semiconductor device according to an embodiment of the invention.

With reference to FIG. 2A, the substrate 10 is provided. Next, the well region 11 is formed in the substrate 10. A method of forming the well region 11 includes performing an ion implantation process on the substrate 10, so as to implant P type or N type ions into the substrate 10, for example. In an embodiment, the well region 11 is an N type well region, for example. Then, a patterned charge storage material layer 13 is formed on the substrate 10. The patterned charge storage material layer 13 includes a nitride layer, which is a silicon nitride layer, for example. The patterned charge storage material layer 13 may be a single-layer or multi-layer composite layer. In an embodiment, the patterned charge storage material layer 13 is a composite layer of a patterned oxide layer 13a/a patterned nitride layer 13b/a patterned oxide layer 13c, for example, and the composite layer may include three or more layers. A method of forming the patterned charge storage material layer 13 includes forming a charge storage material layer on the substrate 10 by chemical vapor deposition or thermal oxidation, and then performing lithography and etching process to the charge storage material layer so as to form the patterned charge storage material layer 13, for example. The patterned charge storage material layer 13 has a first opening 41 that exposes the well region 11.

Figure 2B:
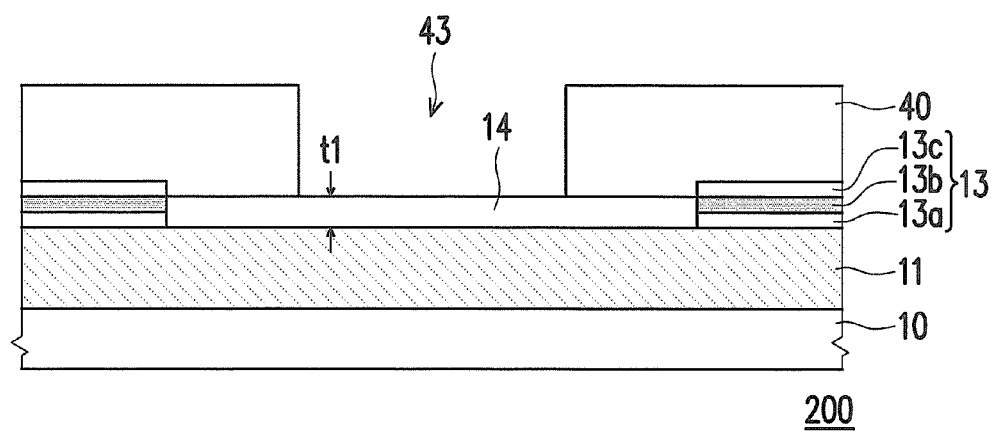

Thereafter, with reference to FIG. 2B, a first dielectric material layer 14 is formed on the well region 11 exposed by the first opening 41. The first dielectric material layer 14 is silicon oxide, silicon nitride, silicon oxynitride, or a high dielectric constant material having a dielectric constant greater than 4, for example. A method of forming the first dielectric material layer 14 is thermal oxidation or chemical vapor deposition, for example. The first dielectric material layer 14 has the first thickness t1 Then, a mask layer 40 is formed on the substrate 10. The mask layer 40 has a second opening 43 that exposes a portion of the first dielectric material layer 14. A material of the mask layer 40 is a photoresist, for example.

Figure 2C:
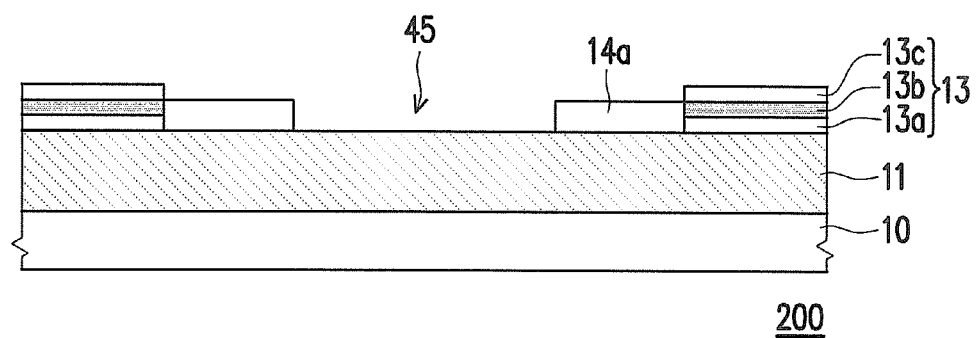

With reference to FIG. 2B and FIG. 2C, the first dielectric material layer 14 exposed by the second opening 43 is removed by performing an etching process with the mask layer 40 as a mask, so as to form a patterned first dielectric material layer 14a. The etching process is anisotropic etching, such as dry etching, for example. The dry etching may be plasma etching, reactive ion etching, etc. The patterned first dielectric material layer 14a has a third opening 45 that exposes the well region 11. Thereafter, the mask layer 40 is removed.

Figure 2D:
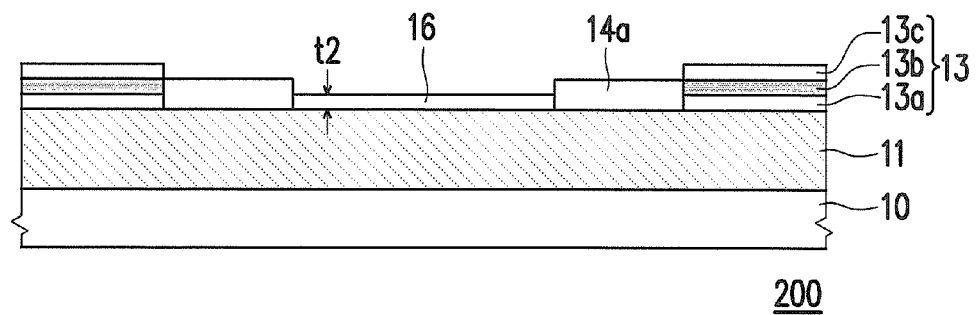

With reference to FIG. 2C and FIG. 2D, a second dielectric material layer 16 is formed on the well region 11 exposed by the third opening 45. The second dielectric material layer 16 is silicon oxide, silicon nitride, silicon oxynitride, or a high dielectric constant material having a dielectric constant greater than 4, for example. A method of forming the second dielectric material layer 16 is thermal oxidation or chemical vapor deposition, for example. The second dielectric material layer 16 has the second thickness t2. The first thickness t1 of the first dielectric material layer 14 is greater than the second thickness t2 of the second dielectric material layer 16. In an embodiment, the first thickness t1 of the first dielectric material layer 14 is in a range of 115-125 angstroms; and the second thickness t2 of the second dielectric material layer 16 is in a range of 35-40 angstroms.

Figure 2E:
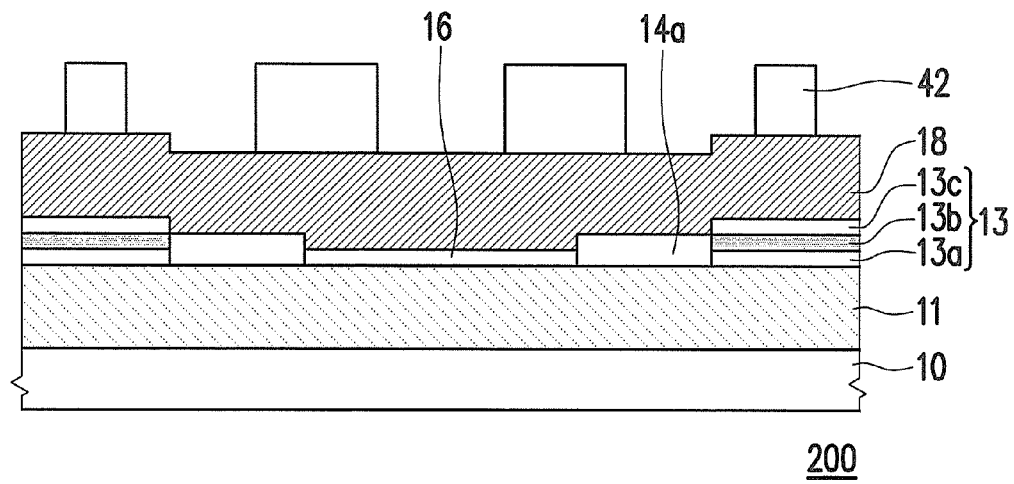
Figure 2F:
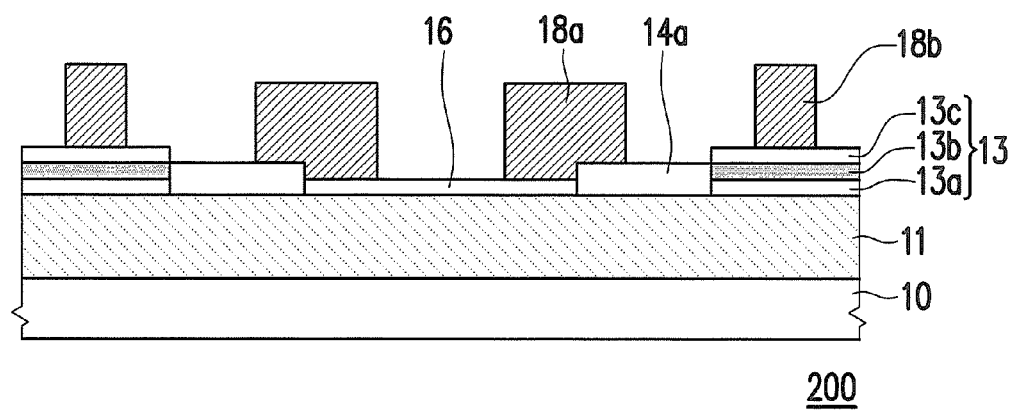

With reference to FIG. 2E and FIG. 2F, a conductor material layer 18 is formed on the substrate 10. The conductor material layer 18 may be formed by chemical vapor deposition or sputtering. The conductor material layer 18 is polysilicon, metal, metal silicide, or a combination of the foregoing, for example. Next, a mask layer 42 is formed on the conductor material layer 18. A material of the mask layer 42 is a photoresist, for example. Then, a patterned conductor material layer 18 is formed by performing an etching process with the mask layer 42 as a mask. Thereafter, the mask layer 42 is removed.

Further, referring to FIG. 2F, the patterned conductor material layer 18 includes at least two select gates 18a and at least two control gates 18b. Moreover, the at least two select gates 18a are disposed between the at least two control gates 18b. In an embodiment, the select gate 18a is disposed on a side of the outermost control gate 18b, for example. Each of the select gates 18a covers a portion of the patterned first dielectric material layer 14a and a portion of the second dielectric material layer 16. Each of the control gates 18b covers a portion of the patterned charge storage material layer 13.

Figure 2G:
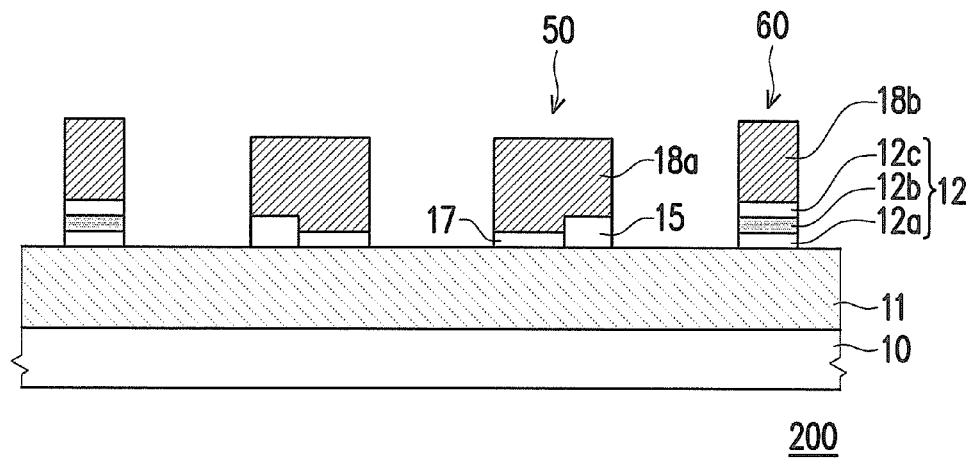

With reference to FIG. 2F and FIG. 2G, the patterned first dielectric material layer 14a and the second dielectric material layer 16 not covered by the select gates 18a are removed, so as to form at least two select gate stack structures 50. Each of the select gate stack structures 50 includes the select gate 18a, the first dielectric layer 15, and the second dielectric layer 17. Meanwhile, the patterned charge storage material layer 13 not covered by the control gates 18b is removed, so as to form at least two control gate stack structures 60. Each of the control gate stack structures 60 includes the control gate 18b and the charge storage layer 12. The charge storage layer 12 is a composite layer of the oxide layer 12a/the nitride layer 12b/the oxide layer 12c, for example. A removing method thereof is anisotropic etching, such as dry etching, for example.

Figure 2H:
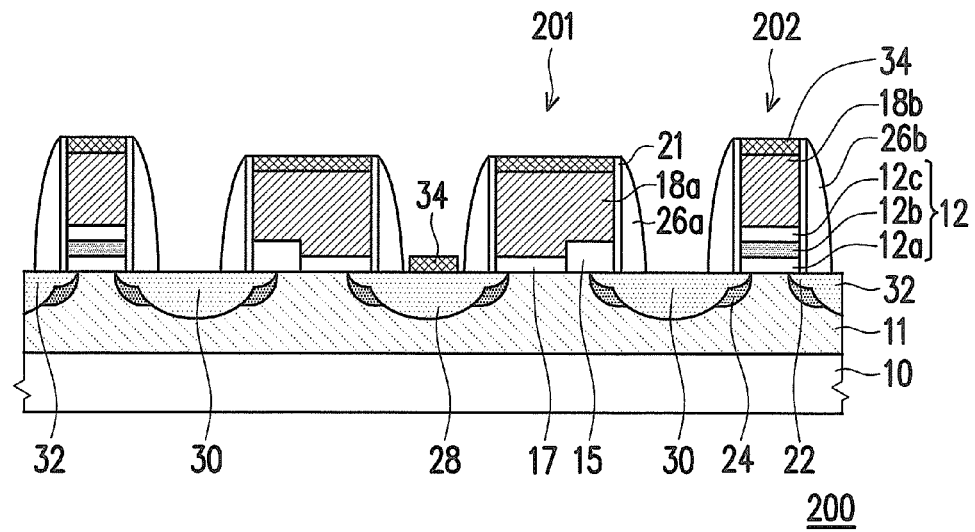

With reference to FIG. 2H, in an embodiment, a thermal process may be performed to repair the damage that the etching process causes to the select gates 18a and the control gates 18b. After performing the thermal process, the liner layer 21 is respectively formed on the sidewall of each select gate stack structure 50 and the sidewall of each control gate stack structure 60.

Next, the lightly doped drain 22 and the pocket implant region 24 may be selectively formed in the substrate 10 on two sides of the select gate stack structures 50 and the control gate stack structures 60. A method of forming the lightly doped drain 22 and the pocket implant region 24 includes respectively performing an ion implantation process on the substrate 10, for example. Then, the spacer 26a and the spacer 26b are respectively formed on the sidewall of each select gate stack structure 50 and the sidewall of each control gate stack structure 60. A method of forming the spacer 26a and the spacer 26b includes conformally disposing a spacer material layer on the substrate 10 by chemical vapor deposition. Then, a portion of the spacer material layer is removed by performing an anisotropic etching process, so as to form the spacer 26a and the spacer 26b respectively on the sidewall of each select gate stack structure 50 and the sidewall of each control gate stack structure 60.

Following the above, the first doped region 28 is formed in the well region 11 between two adjacent select gates 18a. The second doped region 30 is respectively formed in the well region 11 between adjacent select gate 18a and control gate 18b. Moreover, the third doped region 32 is respectively formed in the well region 11 on a side of the control gate 18b that is not adjacent to the select gate 18a. A method of forming the first doped region 28, the second doped region 30, and the third doped region 32 includes implanting a dopant into the substrate 10 by an ion implantation method and then performing a tempering process thereon.

Thereafter, the metal silicide 34 may be selectively formed above each select gate 18a and each control gate 18b respectively. A method of forming the metal silicide 34 includes using a self-align silicide (salicide) process, for example. In an embodiment, the metal silicide 34 may be selectively formed above the first doped region 28 and the third doped region 32.

Then, a semiconductor device 200 including a select transistor 201 and a memory device 202 is formed. The select transistor 201 and the memory device 202 are respectively disposed on the substrate 10 and share the second doped region 30.

The above describes the fabricating method of the semiconductor device 200 according to an embodiment of the invention. However, the fabricating method of the semiconductor device of the invention is not limited to the above descriptions. For example, a fabricating method of a semiconductor device 300 according to another embodiment of the invention is explained in detail below.

FIG. 3A to FIG. 3F are schematic cross-sectional views illustrating the fabricating method of the semiconductor device according to another embodiment of the invention. Components in the semiconductor device 300 that are the same as those in the semiconductor device 200 are marked with the same reference numerals. Materials and forming methods of the same components have been specified in the embodiment of the semiconductor device 200 and thus are not repeated hereinafter.

Figure 3A:
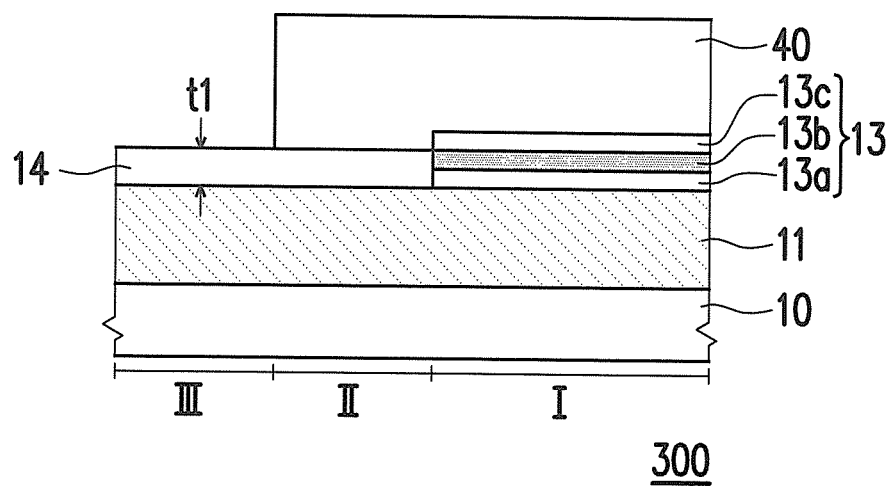
FIG. 3A to FIG. 3F are schematic cross-sectional views illustrating a fabricating method of a semiconductor device according to another embodiment of the invention.

With reference to FIG. 3A, the substrate 10 is provided. The substrate 10 includes a first region I, a second region II, and a third region III. The second region II is between the first region I and the third region III. Next, the well region 11 is formed in the substrate 10. The well region 11 may be the first conductivity type. In an embodiment, the well region 11 is N type, for example. Then, the patterned charge storage material layer 13 is formed on the first region I of the substrate 10. The patterned charge storage material layer 13 is a composite layer of the patterned oxide layer 13a/the patterned nitride layer 13b/the patterned oxide layer 13c, for example. Thereafter, the first dielectric material layer 14 is formed on the second region II and the third region III of the substrate 10 to be adjacent to the patterned charge storage material layer 13. The first dielectric material layer 14 has the first thickness t1, for example. Then, the mask layer 40 is formed on the first region I and the second region II of the substrate 10.

Figure 3B:
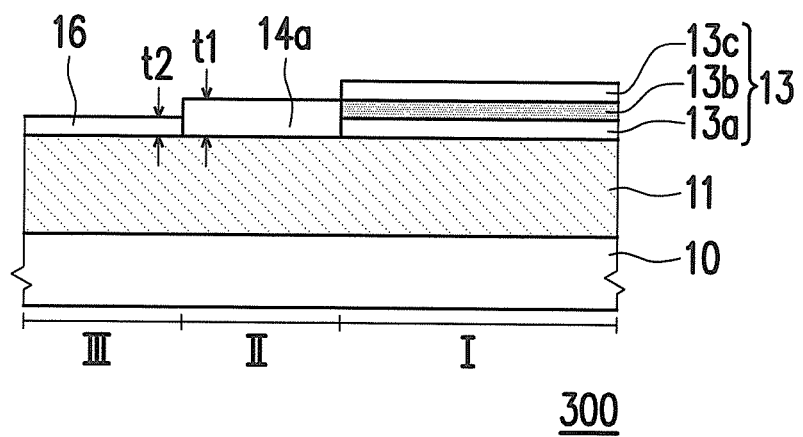

With reference to FIG. 3A and FIG. 3B, the first dielectric material layer 14 on the third region III is removed by performing an etching process with the mask layer 40 as a mask, so as to expose the substrate 10 in the third region III and form the patterned first dielectric material layer 14a on the second region II of the substrate 10. Thereafter, the mask layer 40 is removed. The second dielectric material layer 16 is formed on the third region III of the substrate 10. The second dielectric material layer 16 has the second thickness t2, for example.

Figure 3C:
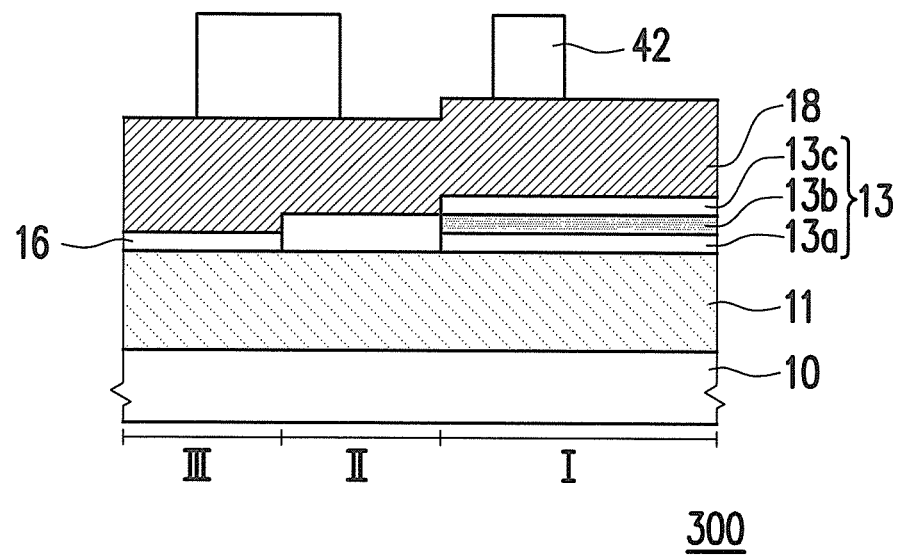
Figure 3D:
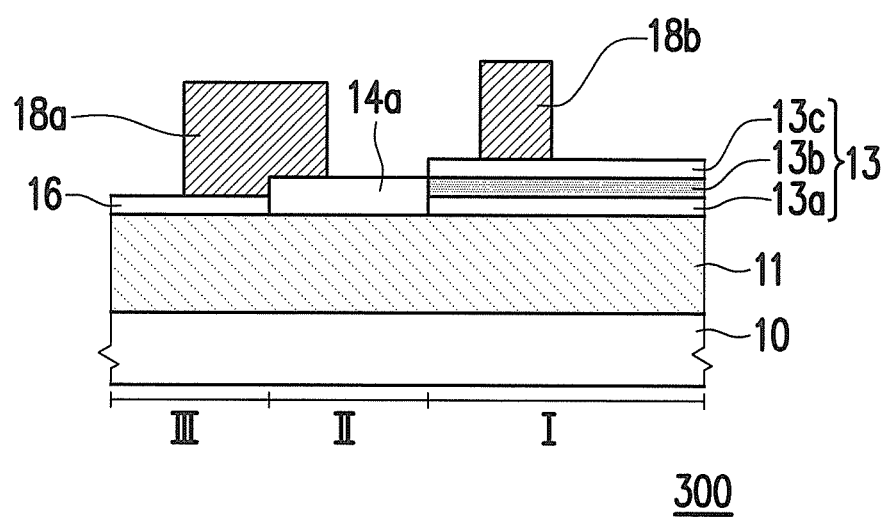

With reference to FIG. 3C and FIG. 3D, the conductor material layer 18 is formed on the substrate 10. Then, the mask layer 42 is formed on the conductor material layer 18. Further, the patterned conductor material layer 18 is formed by performing an etching process with the mask layer 42 as a mask. Next, the mask layer 42 is removed. The patterned conductor material layer 18 includes the select gate 18a and the control gate 18b. The select gate 18a covers a portion of the patterned first dielectric material layer 14a and a portion of the second dielectric material layer 16. The control gate 18b covers a portion of the patterned charge storage material layer 13. In an embodiment, the length of the select gate 18a is greater than the length of the control gate 18b.

Figure 3E:
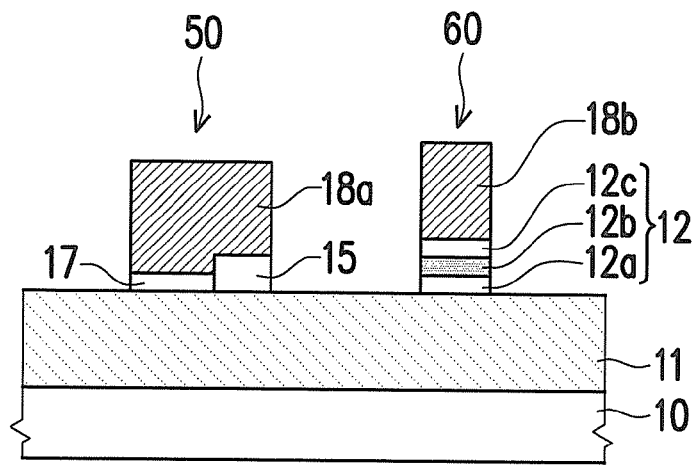

With reference to FIG. 3E, the patterned first dielectric material layer 14a and the second dielectric material layer 16 not covered by the select gate 18a are removed, so as to form the select gate stack structure 50. The select gate stack structure 50 includes the select gate 18a, the first dielectric layer 15, and the second dielectric layer 17. Meanwhile, the patterned charge storage material layer 13 not covered by the control gate 18b is removed, so as to form the control gate stack structure 60. The control gate stack structure 60 includes the control gate 18b and the charge storage layer 12. In an embodiment, the charge storage layer 12 is a composite layer of the oxide layer 12a/the nitride layer 12b/the oxide layer 12c, for example.

Figure 3F:
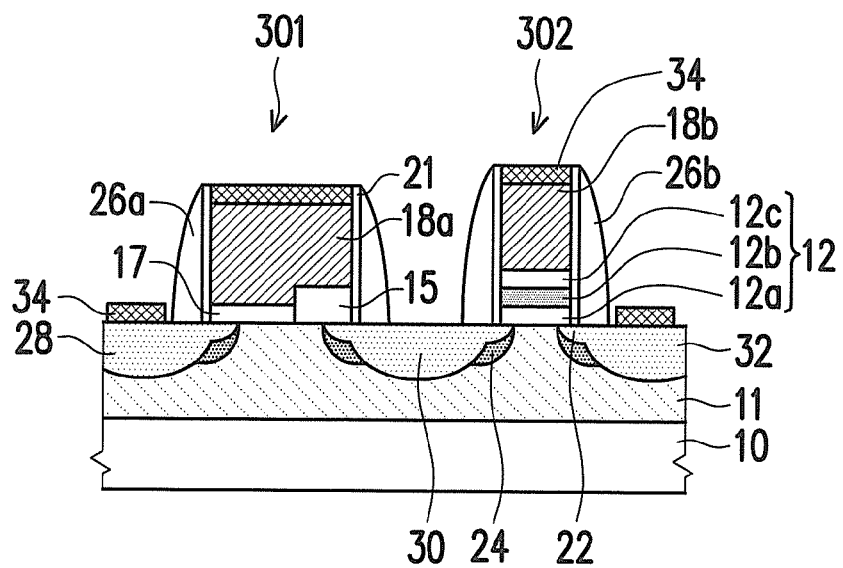

With reference to FIG. 3F, the liner layer 21 may be respectively formed on the sidewalls of the select gate stack structure 50 and the sidewall of the control gate stack structure 60. In addition, the lightly doped drain 22 or the pocket implant region 24 may be selectively formed in the substrate 10 on two sides of the select gate stack structure 50 and the control gate stack structure 60. The lightly doped drain 22 may be the second conductivity type; and the pocket implant region 24 may be the first conductivity type. In an embodiment, the lightly doped drain 22 is P type; and the pocket implant region 24 is N type, for example. Then, the spacer 26a and the spacer 26b are respectively formed on the sidewall of each select gate stack structure 50 and the sidewall of each control gate stack structure 60.

Thereafter, the first doped region 28 is formed in the substrate 10 on a side of the select gate 18a that is not adjacent to the control gate 18b. The second doped region 30 is formed in the substrate 10 between the select gate 18a and the control gate 18b. Furthermore, the third doped region 32 is formed in the substrate 10 on a side of the control gate 18b that is not adjacent to the select gate 18a. The first doped region 28, the second doped region 30, and the third doped region 32 are located in the well region 11. The first doped region 28, the second doped region 30, and the third doped region 32 are the second conductivity type. In an embodiment, the first doped region 28, the second doped region 30, and the third doped region 32 are P type, for example. Then, the metal silicide 34 is formed above the select gate 18a and the control gate 18b. In an embodiment, the metal silicide 34 may be selectively formed above the substrate 10 of the first doped region 28 and the third doped region 32.

Then, a semiconductor device 300 including a select transistor 301 and a memory device 302 is formed. The select transistor 301 and the memory device 302 are disposed on the substrate 10 and are electrically connected with each other.

Endurance tests are performed on a conventional semiconductor device and an embodiment of the invention by programming and erasing cycle operations. The conventional semiconductor device includes a select transistor having a dielectric layer of a uniform thickness, wherein a length of the dielectric layer is 0.18 μm and the thickness thereof is 120 angstroms. After 1000 times of programming and erasing cycle operations of the conventional semiconductor device, the programming voltage is about 3.11V, the erasing voltage is about 0.65V, the programming current of the conventional semiconductor device decreases is about 34.7 μA, and the erasing current is about 18.5 μA.

The semiconductor device of the invention includes a select transistor including the first dielectric layer and the second dielectric layer. In the semiconductor device of the invention, the thicknesses of the first dielectric layer and the second dielectric layer are 125 angstroms and 35 angstroms respectively. A total length of the first dielectric layer and the second dielectric layer is 0.24 μm, wherein a length of the first dielectric layer, which is thicker, is 0.20 μm. After 1000 times of programming and erasing cycle operations of the semiconductor device of the invention, the programming voltage decreases is about 3.35V, the erasing voltage is about 0.8V, the programming current of the semiconductor device of the invention decreases from is about 45.0 μA, and the erasing current is about 21.8 μA.

It can be known from the results that the semiconductor device of the invention, which includes the select transistor having dielectric layers of different thicknesses, can sustain 1000 times of programming and erasing cycle operations and achieve performance equivalent to the conventional semiconductor device that includes the select transistor of uniform thickness, and obtain an increase of current of about 7 μA.

To conclude the above, in the semiconductor device of the invention, the select transistor includes the first dielectric layer having the first thickness and the second dielectric layer having the second thickness, and the first thickness of the first dielectric layer is greater than the second thickness of the second dielectric layer. Because the second dielectric layer is thinner, the select transistor has a lower operation voltage to increase the speed of turning on/off the select transistor. Moreover, the first dielectric layer disposed closer to the memory device is thicker than the second dielectric layer. Thus, while the select transistor has a low operation voltage, the select transistor can sustain the high voltage applied by the adjacent memory cells to maintain the product performance. Further, given that the number of times of endurance remains the same, the semiconductor device of the invention obtains a greater increase in current, namely, obtaining a greater current under the same low operation voltage.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device, comprising:
   a substrate;
   a memory device disposed on the substrate, wherein the memory device comprises:
   a control gate disposed on the substrate; and
   a charge storage layer disposed between the control gate and the substrate;
   a select transistor disposed on the substrate and electrically connected with the memory device, wherein the select transistor comprises:
   a select gate disposed on the substrate;
   a first dielectric layer having a first thickness and disposed between the select gate and the substrate; and
   a second dielectric layer having a second thickness and disposed between the select gate and the substrate and adjacent to the first dielectric layer;
   a first doped region disposed in the substrate between two adjacent select gates; and
   a second doped region disposed in the substrate between the select gate and the control gate,
   wherein the first dielectric layer is closer to the memory device than the second dielectric layer, the first thickness is greater than the second thickness, and the select transistor electrically connected with the memory device through the second doped region,
   wherein a length of the first dielectric layer is greater than ⅕ of a sum of lengths of the first dielectric layer and the second dielectric layer in a direction perpendicular to an extending direction of the select gate.

2. The semiconductor device according to claim 1, wherein a ratio of the second thickness to the first thickness is in a range of ⅒ to ⅔.

3. The semiconductor device according to claim 1, wherein the first thickness is in a range of 60-160 angstroms.

4. The semiconductor device according to claim 1, wherein the second thickness is in a range of 16-40 angstroms.

5. The semiconductor device according to claim 1, wherein the length of the first dielectric layer is in a range of ⅕ to ½ of the sum of the lengths of the first dielectric layer and the second dielectric layer in a direction perpendicular to an extending direction of the select gate.

6. The semiconductor device according to claim 1, further comprising:
   a third doped region disposed in the substrate on a side of the control gate that is not adjacent to the select gate.

7. The semiconductor device according to claim 6, further comprising a well region disposed in the substrate, wherein the first doped region, the second doped region, and the third doped region are disposed in the well region, and the well region is a first conductivity type; and the first doped region, the second doped region, and the third doped region are a second conductivity type.

8. A fabricating method for fabricating a semiconductor device, the fabricating method comprising:
   providing a substrate;
   forming a patterned charge storage material layer on the substrate, wherein the patterned charge storage material layer comprises a first opening that exposes the substrate;
   forming a first dielectric material layer on the substrate exposed by the first opening;
   forming a mask layer on the substrate, wherein the mask layer comprises a second opening that exposes the first dielectric material layer;
   removing the first dielectric material layer exposed by the second opening with the mask layer as a mask to form a patterned first dielectric material layer, wherein the patterned first dielectric material layer comprises a third opening that exposes the substrate;

removing the mask layer;

forming a second dielectric material layer on the substrate exposed by the third opening;

forming at least two control gates on the substrate and forming at least two select gates between the control gates, wherein each of the select gates covers a portion of the patterned first dielectric material layer and a portion of the second dielectric material layer, and each of the control gates covers a portion of the charge storage material layer; and removing the patterned first dielectric material layer and the second dielectric material layer not covered by the select gates to form at least two first dielectric layers and at least two second dielectric layers, and removing the patterned charge storage material layer not covered by the control gates to form at least two charge storage layers, wherein each of the first dielectric layers has a first thickness, each of the second dielectric layers has a second thickness, and the first thickness is greater than the second thickness.

9. The fabricating method according to claim 8, further comprising:

forming a first doped region in the substrate between two adjacent select gates;

forming a second doped region in the substrate between each of the select gates and the control gate adjacent thereto; and forming a third doped region in the substrate on a side of each of the control gates not adjacent to the select gates.

10. The fabricating method according to claim 9, further comprising: forming a well region in the substrate, wherein the first doped region, the second doped regions, and the third doped regions are disposed in the well region, and the well region is a first conductivity type; and the first doped region, the second doped regions, and the third doped regions are a second conductivity type.

11. The fabricating method according to claim 8, wherein a length of the first dielectric layer is greater than $\frac{1}{5}$ of a sum of lengths of the first dielectric layer and the second dielectric layer in a direction perpendicular to an extending direction of the select gate.

12. A semiconductor device, comprising:

a substrate;

a memory device disposed on the substrate, wherein the memory device comprises:

a control gate disposed on the substrate; and a charge storage layer disposed between the control gate and the substrate;

a select transistor disposed on the substrate and electrically connected with the memory device, wherein the select transistor comprises:

a select gate disposed on the substrate;

a first dielectric layer having a first thickness and disposed between the select gate and the substrate; and a second dielectric layer having a second thickness and disposed between the select gate and the substrate and adjacent to the first dielectric layer;

a first doped region disposed in the substrate between two adjacent select gates; and a second doped region disposed in the substrate between the select gate and the control gate, wherein the first dielectric layer is closer to the memory device than the second dielectric layer, the first thickness is greater than the second thickness, and the select transistor electrically connected with the memory device through the second doped region, wherein a length of the select gate is greater than a length of the control gate in a direction perpendicular to an extending direction of the select gate.

* * * * *